United States Patent
Karidis et al.

(10) Patent No.: US 9,104,568 B2
(45) Date of Patent: Aug. 11, 2015

(54) DETECTION OF MEMORY CELLS THAT ARE STUCK IN A PHYSICAL STATE

(71) Applicant: International Business Machines Corporation, Armonk, NY (US)

(72) Inventors: John P. Karidis, Ossining, NY (US); Luis A. Lastras, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 13/835,985

(22) Filed: Mar. 15, 2013

(65) Prior Publication Data

US 2014/0281725 A1   Sep. 18, 2014

(51) Int. Cl.
*G11C 29/00*  (2006.01)
*G06F 11/07*  (2006.01)

(52) U.S. Cl.
CPC ............................... *G06F 11/0751* (2013.01)

(58) Field of Classification Search
CPC ............ G06F 11/0751; G01R 31/3004; G01R 31/31835; G01R 31/2891
USPC .................... 714/718, 727, 741, 37
See application file for complete search history.

(56) References Cited

U.S. PATENT DOCUMENTS

| | | | | |
|---|---|---|---|---|
| 5,303,246 A | * | 4/1994 | Anderson et al. | 714/727 |
| 5,377,148 A | * | 12/1994 | Rajsuman | 365/201 |
| 6,202,181 B1 | * | 3/2001 | Ferguson et al. | 714/724 |
| 6,560,736 B2 | * | 5/2003 | Ferguson et al. | 714/724 |
| 2003/0217315 A1 | * | 11/2003 | Maamari et al. | 714/741 |
| 2009/0109737 A1 | | 4/2009 | Kostylev | |
| 2011/0019466 A1 | | 1/2011 | Wang et al. | |
| 2011/0063918 A1 | | 3/2011 | Pei et al. | |
| 2012/0314516 A1 | * | 12/2012 | Campbell et al. | 365/189.11 |
| 2013/0019130 A1 | * | 1/2013 | Hakhumyan et al. | 714/718 |

FOREIGN PATENT DOCUMENTS

| | | |
|---|---|---|
| EP | 0350538 B1 | 1/1990 |
| EP | 0614089 A2 | 9/1994 |

* cited by examiner

*Primary Examiner* — David Ton
(74) *Attorney, Agent, or Firm* — Cantor Colburn LLP

(57) ABSTRACT

A method for detecting memory cells that are stuck in a physical state. The method includes performing a diagnostic read of a memory cell in a memory system. The memory system is configured to utilize at least one read threshold value to determine a read data value stored in the memory cell when performing a data read operation on the memory cell. Performing the diagnostic read includes: comparing a measurement property of the memory cell to at least one diagnostic threshold value, where at least one of the diagnostic threshold values is different from all of the read threshold values; and identifying the memory cell as being stuck in a physical state based on the comparing. Based on identifying the memory cell as being stuck in a physical state, an indication that memory cell is stuck is output along with a diagnostic data value associated with the physical state.

20 Claims, 10 Drawing Sheets

DETECTION OF MEMORY CELLS THAT ARE STUCK IN A PHYSICAL STATE

BACKGROUND

The present invention relates generally to computer memory, and more specifically, to the detection of memory cells that are stuck in a physical state.

In some memory technologies, a common failure mechanism for a memory cell is for the memory cell to experience a change in its capability to convert to a desired state, typically as a result of too many write attempts. For example, in phase change memory (PCM) it has been documented that after a certain number of write attempts, a memory cell may either fail to "reset" fully or it may become stuck in a very high resistance state as a result of the cell effectively becoming detached from its electrode. In the case of a binary PCM, memory cells experiencing these phenomena may be perceived as "stuck-at set" or "stuck-at reset." In the case of a multilevel PCM, failing to reset fully may manifest as an inability to reach the higher resistance levels, while being stuck in a very high resistance level may manifest as being stuck in the level with highest resistance.

SUMMARY

Embodiments include a method, system, and computer program product for detecting memory cells that are stuck in a physical state. The method includes performing a diagnostic read of a memory cell in a memory system. The memory system is configured to utilize at least one read threshold value to determine a read data value stored in the memory cell when performing a data read operation on the memory cell. Performing the diagnostic read includes: comparing a measurement property of the memory cell to at least one diagnostic threshold value, where at least one of the diagnostic threshold values is different from all of the read threshold values; and identifying the memory cell as being stuck in a physical state based on the comparing. Based on identifying the memory cell as being stuck in a physical state, an indication that memory cell is stuck is output along with a diagnostic data value associated with the physical state.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
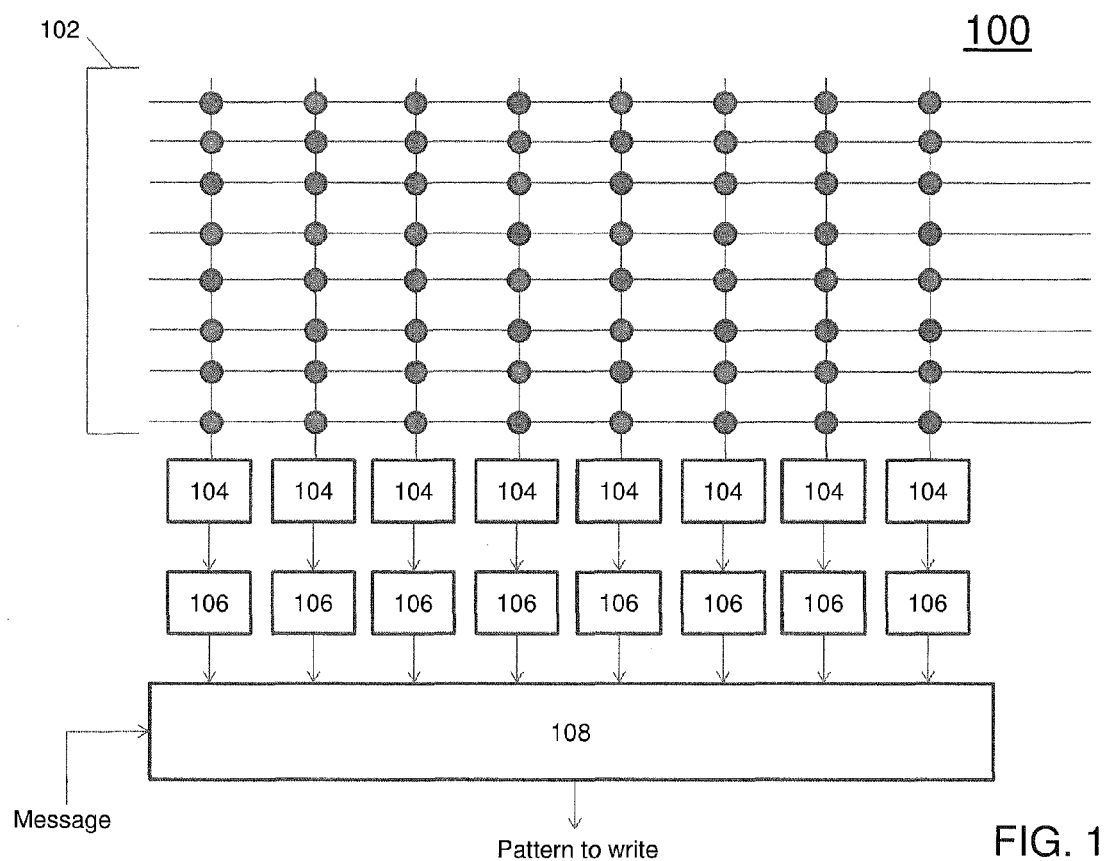
FIG. 1 depicts an exemplary system in accordance with an embodiment.

As described herein, embodiments are directed to determining whether a memory cell is stuck in a physical state, as well as the value that the stuck memory cell contains (i.e., the stuck-at value of the memory cell). For example, a memory cell in a binary phase change memory (PCM) that is stuck in a physical state may be stuck-at a value of "set" or stuck-at a value of "reset." An embodiment relies on using higher resolution reading circuitry than that used to perform a read of the memory cell. The higher resolution reading circuitry senses more accurately the state of the memory cell, resulting in more levels than originally intended as information output from the memory cell. These levels are then interpreted by a controller (e.g., a memory controller) which assigns some of them to be genuine levels (e.g., set or reset) and some of them to be levels indicating a stuck-at condition (e.g., stuck-at set or stuck-at reset). This mechanism for sensing a stuck-at condition is in principle no more damaging to a memory cell than a standard reading action.

An embodiment described herein uses a write action on a memory cell that is known not to damage the memory cell as much as a write to the memory cell to determine whether the memory cell is able to at least make a certain kind of transition. For example, in the case of PCM it is known that the process of annealing a memory cell (making it closer to the set state) is generally not nearly as potentially damaging as the process of resetting the memory cell. A memory cell that is stuck-at reset, either due to the open circuit phenomenon described earlier or any other phenomenon could be sensed to be in this stuck condition by such a write action. Note that this procedure does not need in principle an increased resolution reading circuitry.

While many of the illustrative embodiments are described herein with respect to PCM, aspects of the disclosure may be applied to other types of memory technologies, such as, but not limited to magnetic random access memory (MRAM). Furthermore, aspects of the disclosure may be applied in connection with a variety of applications. For example, the techniques described herein may be applied in connection with computer forensics. In some embodiments, a diagnostic read operation is performed to determine what happened to one or more memory cells, or to recover past or pre-existing values associated with the memory cells.

Memory technologies, such as PCM, are limited lifetime in terms of available write cycles of the memory. In the case of PCM, the amount of current used for resetting a memory cell may be limited in order to increase the lifetime of the memory cell. In addition to using a variety of materials and memory circuit design venues for preventing faults and for extending the lifetime of a memory, one can employ error correction technology to correct, at the time of reading the memory, any errors that have surfaced. The use of standard error correcting is and will likely remain an important device for addressing memory reliability issues. Nonetheless, in a situation where a significant fraction of the errors manifest themselves as stuck memory cells, and hence in principle can be unveiled at the time of writing (as opposed to the time of reading) of the memory, other important possibilities exist.

One possibility is to employ what is known as codes for stuck-at faults. The basic principle behind these coding techniques is that they encode a desired message to be imprinted in a memory into a pattern that conforms to whatever physical limitations the memory happens to have, effectively concealing these errors. These physical limitations are communicated to the stuck-at encoding mechanism, but importantly, need not be communicated to the decoding mechanism that is used at the time of reading the memory. Thus, the decoding mechanism, when reading from a memory whose errors were concealed at encoding time, experiences no error whatsoever. Even if errors other than those concealed at encoding time do arise, only those new errors need to be effectively corrected for at the decoder when the coding technology is properly designed.

The use of codes for stuck-at faults has benefits well beyond improvements in decoding latency and complexity. These codes are also often much more effective redundancy-wise than standard error correcting codes for the purposes of dealing with stuck-at faults. All of these advantages are in principle quite significant to practical applications. Nonetheless, there is an important assumption in the use of stuck-at coding, which is that the information about which memory cells are stuck and their stuck-at values must be made available to the decoder at write time, each time that a write takes place. One solution is to store the location of stuck memory cells in some storage space. This solution preserves the decoding complexity advantages of stuck-at codes, nonetheless the redundant storage may diminish some of the advantages of using codes for stuck-at faults.

Embodiments described herein provide a way of sensing whether a memory cell is stuck and its stuck value in certain kinds of memory technologies in a manner such that the memory cell experiences little or no wear as a result of the sensing action. This generic sensing device can be employed in conjunction with stuck-at codes to bring benefits to the user of these memories technologies, effectively extending the lifetime of the memory while simultaneously improving decoding time and complexity.

In an embodiment, this sensing scheme is applied in the initial stage of a protocol for writing to a memory. In the initial stage, the information about which memory cells are stuck and their stuck-at value is obtained. Then, this information is passed to a stuck-at encoder, which also receives the desired message to be stored in the memory. The result of the stuck-at encoder is then written into the memory; at this step a choice can be made to either not write to those memory locations that have been deemed stuck, or to attempt to write the stuck-at value to reinforce this state as the one the decoder should receive. The general process is described below with reference to FIG. 1, which shows an array of memory cells. Whenever a given message is to be written to memory in a memory system, a corresponding row in the array of memory cells is selected and a reading action is performed that results in multiple levels. One multi-level sensing device per bit-line may be assigned or a multi-level sensing device may be a shared resource among multiple bit-lines.

Turning to FIG. 1, an exemplary system 100 is shown including an array 102 of memory cells, multi-level sensing devices or circuits 104, stuck cell analysis devices 106, and an encoder 108. The system 100 may be associated with one or more memory devices. In some embodiments, when a message is to be written to the memory, a corresponding row of the array 102 is selected, and a read operation (e.g., a diagnostic read operation) may be performed which may result in multiple levels. The multi-level sensing circuits 104 may each be assigned to a "bit-line" (e.g., one of the vertical lines associated with the array 102). In some embodiments, a multi-level sensing circuit 104 is shared among multiple bit-lines.

In some embodiments, the stuck cell analysis devices 106 are configured to map one or more levels (e.g., resistance levels) to denote memory cells stuck to a given value, while mapping one or more other levels to acceptable values for a healthy memory cell. For example, assuming that one bit is stored per memory cell (disregarding potential redundancy), a standard (data) read operation may distinguish between two different memory cell states. In the case of PCM, the information may be encoded as a resistance value measured from the memory cell, such that the two memory cell states may correspond to a high resistance and a low resistance.

Figure 2:
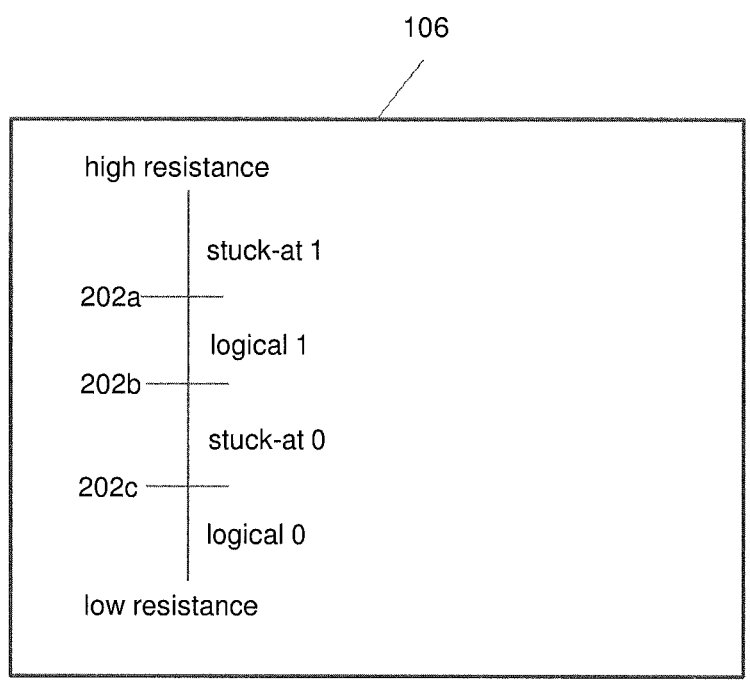
FIG. 2 depicts an exemplary stuck memory cell analysis device in accordance with an embodiment.

In some embodiments, the stuck cell analysis devices 106 are configured to measure whether a memory cell has content in any number of different resistance ranges. As an example, FIG. 2 shows an assignment of four different resistance ranges to a logical value for the memory cell and to a stuck-at condition. In order to generate the four different resistance ranges, three threshold values 202a-202c are used. For example, resistance above threshold value 202a may correspond to a stuck-at 1 condition. Resistance above threshold value 202b and below threshold value 202a may correspond to a (healthy) logical 1. Resistance above threshold value 202c and below threshold value 202b may correspond to a stuck-at 0 condition. Resistance below threshold value 202c may correspond to a (healthy) logical 0. Information relating to which of the four resistance ranges a memory cell happens to be in is obtained via three parallel threshold value reads or two sequential threshold value reads, among other possible sensing techniques.

In some embodiments, the particular threshold values or levels used are tuned or selected in accordance with one or more factors, such as the type of memory used, a required system reliability or endurance parameter, etc.

One type of failure mechanism for a PCM cell is for the memory cell to become open or detached from its electrode, causing a very high resistance state that may be significantly larger than an amorphous state's resistance. Accordingly, the very high resistance range may correspond to a stuck-at 1 state. The next resistance range, which may correspond to a healthy memory cell's reset resistance range, may correspond to a logical 1.

A PCM cell can also fail to reset. For example, a pulse applied to the memory cell might not fully convert the memory cell into a particular state. This may result in a resistance that is larger than a set resistance, but lower than a reset resistance. A memory cell experiencing a resistance in such a range may be referred to as stuck-at 0.

Repeated write attempts to a memory cell that has difficulties resetting (e.g., a memory cell that fails to reset) may further degrade the reset resistance, making the reset resistance even closer to the set resistance. As such, a memory cell may begin to have a resistance that appears like a genuine logical 0.

In some embodiments, a memory cell that is perceived to be stuck is written less frequently than the memory cell otherwise would be under normal or typical operating conditions (e.g., when the memory cell is healthy). In the case of a memory cell that fails to reset, such a policy is used to slow down a degradation of the reset resistance.

In some embodiments, write operations are conditioned by a controller such that a memory cell that is stuck-at 1 might only be written with a value of 1. Similarly, write operations may be conditioned by a controller such that a memory cell that is stuck-at 0 might only be written with a value of 0. In this manner, issues or problems that are associated with a read of a memory cell with a stuck-at condition might be avoided by (only) writing values corresponding to the stuck-at condition.

The stuck cell analysis could potentially be erroneous occasionally. For example, a stuck cell analysis device 106 may qualify a memory cell as stuck when it is not stuck and vice versa may qualify a memory cell as not stuck when it is stuck. In some embodiments, additional functionality is implemented to address erroneous stuck cell analysis. For example, aspects of the disclosure may be combined with coding for stuck-at faults as described above and/or error correcting technology which can deal with errors during a read operation.

In some embodiments, the output of the resistance region analysis is disregarded with a frequency that depends on the outcome of the sensing and/or on a programmable input parameter. As an example, assume that the resistance region analysis (optionally performed by a stuck cell analysis device 106) indicates that a memory cell is stuck-at 0. Then, with a probability (p), where p may be equal to 0.01 (1%), the analysis is disregarded and a controller attempts to write that memory cell with a desired value. If the memory cell was actually healthy and was incorrectly qualified as stuck-at 0, then the memory cell will correctly store the desired value. On the other hand, if the memory cell is actually stuck-at 0, error correcting codes (ECC) may be used correct the value at the time of a read operation. Similarly, if the resistance region analysis indicates that a second memory cell is stuck-at 1, the analysis may be disregarded and the controller attempts to write the second memory cell with a desired value using a probability (q), where q may be equal to 0.001 (0.1%). The probability q may be made smaller than the probability p, given that stuck-at 1 events may be more drastic relative to 0 events with respect to permanence in a memory cell.

In some embodiments, the resistance region or stuck cell analyses performed by a stuck cell analysis device 106 is/are provided to the encoder 108. The encoder 108 uses such information to generate a pattern to write to memory based on an input message as shown in FIG. 1.

In some embodiments, multi-resolution reading is combined with additional techniques to obtain information regarding the state of a memory cell. For example, in some embodiments, a pulse is applied to a memory cell that would neither fully set nor fully reset the memory cell. Instead, the applied pulse has an effect of slightly changing the state of the memory cell.

Using pulses that do not fully set or fully reset a memory cell help to avoid damaging the memory cell. For example, a memory cell may be "micro-annealed" based on a pulse, which lowers the resistance of the memory cell by a slight amount. In an embodiment, a multi-resolution read performed on the memory cell both before and after the pulse is used to measure the change or delta in the resistance. Using pulses reduces energy expended in analyzing stuck-at conditions in memory cells relative to full (set) pulses.

Figure 3:
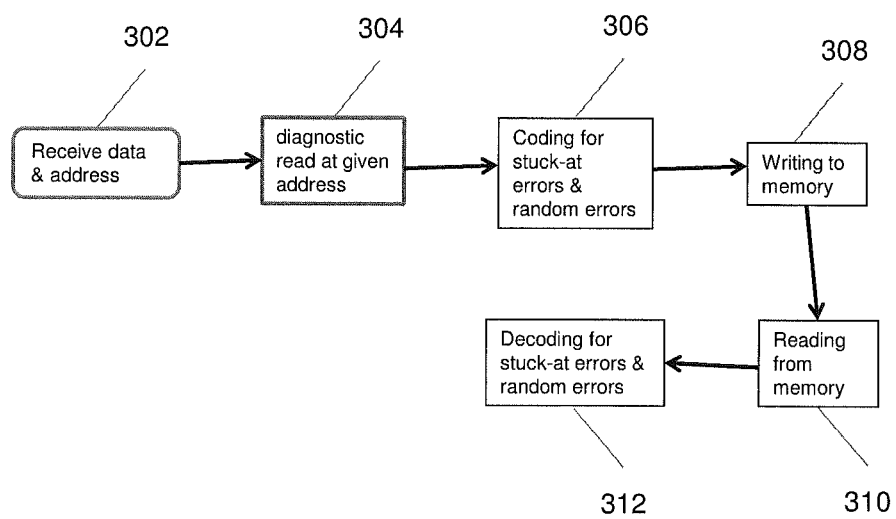
FIG. 3 depicts a process flow for sensing stuck-at conditions in a memory using a diagnostic read in accordance with an embodiment.

FIG. 3 illustrates a flow diagram in accordance with one or more exemplary embodiments. In block 302, data to be written to an address in memory is received. At block 304, a diagnostic read (e.g., a resistance region analysis) is performed at the address specified in block 302. In block 306, coding for stuck-at errors and random errors is performed. The coding may take into account the diagnostic data values determined at block 304. In an embodiment, the range of the diagnostic data values is the same as the range of the read data values. In block 308, the memory is written at the specified address. In block 310, the memory is read at the specified address using a standard or typical data read operation. In block 312, decoding for stuck-at errors and random errors is performed.

Figure 4:
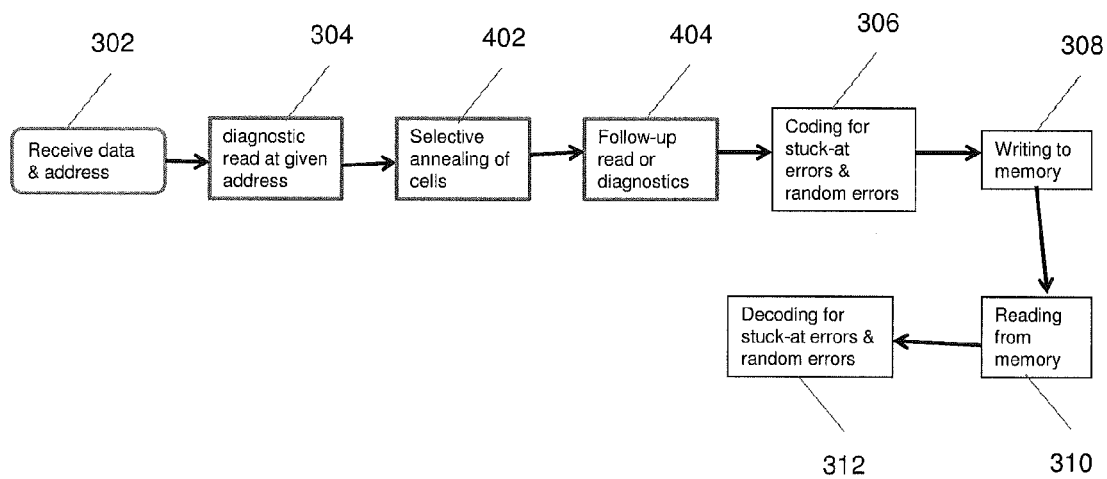
FIG. 4 depicts a process flow for sensing stuck-at conditions in a memory using a diagnostic read and an annealing pulse in accordance with an embodiment.

FIG. 4 illustrates a flow diagram in accordance with one or more exemplary embodiments. Relative to the flow diagram of FIG. 3, the flow diagram of FIG. 4 includes two additional blocks 402 and 404. In block 402, one or more memory cells is selectively annealed, potentially based on the diagnostic read of block 304. In block 404, a follow-up (diagnostic) read is performed in order to determine or gauge the effect of the annealing of block 402.

Figure 5:
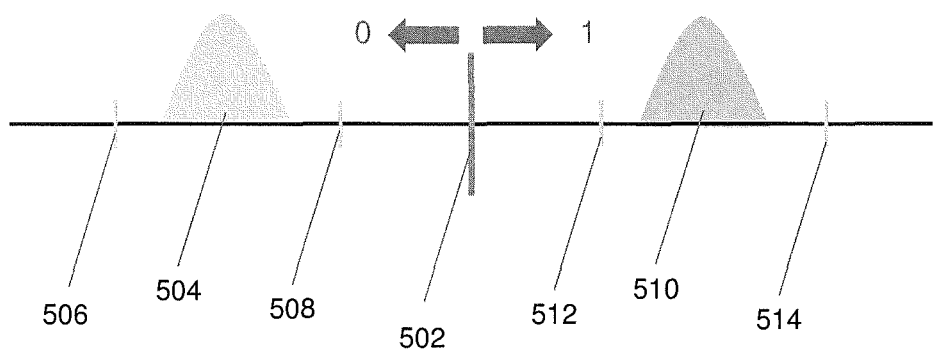
FIGS. 5-9 depict exemplary distributions of memory cell resistances in accordance with exemplary embodiments.

FIG. 5 illustrates an exemplary distribution of resistance for a healthy memory cell. The good state of health may be indicative of the memory cell prior to the memory cell undergoing extensive cycling. For ease of illustration, it may be assumed that set corresponds to a logical 0 (e.g., to the left of a read threshold value 502), and that reset corresponds to a logical 1 (to the right of the read threshold value 502) during, e.g., data read operations. As shown, a distribution 504 associated with the set state may fall within threshold values 506 and 508. Similarly, a distribution 510 associated with the reset state may fall within threshold values 512 and 514. The distributions 504 and 510 may be acquired in connection with diagnostic read operations, and the horizontal axis may correspond to resistance values associated with the memory cell.

Figure 6:
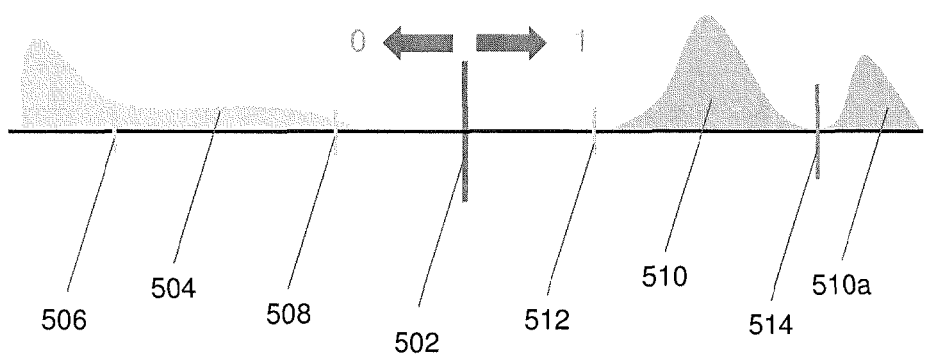

When a memory cell begins to fail, which in some embodiments is at least partially a result of cycling or writing, relative to FIG. 5 the distribution 504 may exceed one or both of threshold values 506 and 508 and/or the distribution 510 may exceed one or both of threshold values 512 and 514. An example of such a scenario is shown in FIG. 6. In FIG. 6, a portion 510a of the reset distribution 510 exceeds the threshold value 514. Such a condition of an abnormally high resistance may be associated with an open cell condition, such that the memory cell may be stuck-at 1.

Figure 7:
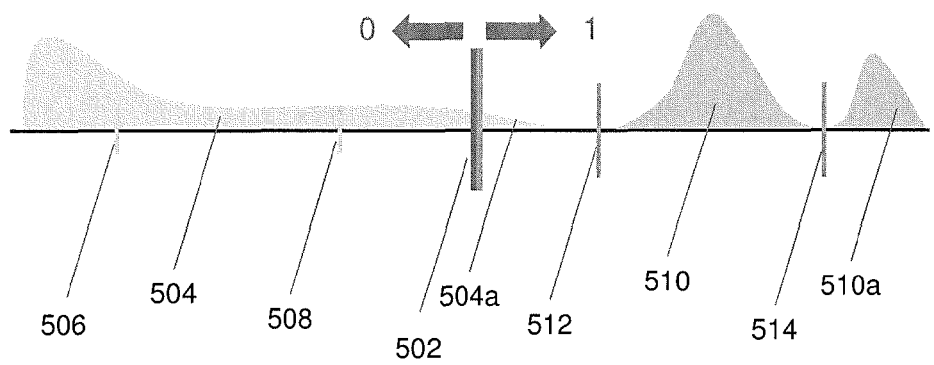

FIG. 7 illustrates a scenario which may be used to detect open memory cells and memory cells with high set resistance. In FIG. 7, three threshold values (also referred to herein as "diagnostic threshold values") may be used during diagnostic reads. If a distribution (e.g., the portion 510a) is detected to the right of threshold value 514, such a distribution may be indicative of an open cell condition as in FIG. 6. The memory cell may be deemed healthy for the distribution 510 in a range between threshold values 512 and 514. The region between threshold value 502 and 512 may be used to detect an abnormally high set resistance (reflected via a portion 504a of the distribution 504 exceeding the threshold value 502 to the right of the threshold value 502), which may manifest itself by reading a logical '1' when a logical '0' was written to the memory cell. An abnormally high set resistance may result in the memory cell being deemed stuck-at 1 (i.e., having a diagnostic data value of 1).

Figure 8:
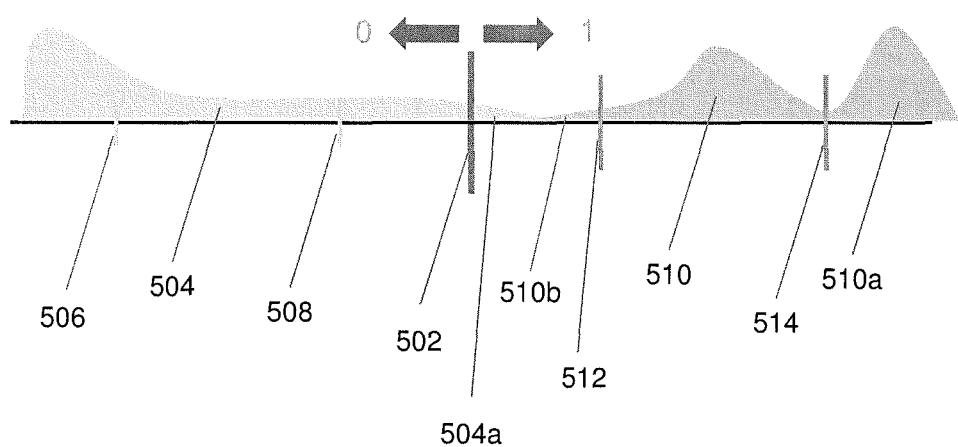

FIG. 8 illustrates a scenario that may be used to detect open memory cells and memory cells with high set resistance. In particular, the scenario depicted in FIG. 8 includes the portion 504a overlapping with a portion 510b of the distribution 510 in the region between threshold values 502 and 512. In FIG. 8, two diagnostic threshold values may be used during diagnostic reads. If a distribution (e.g., the portion 510a) is detected to the right of threshold value 514, such a distribution may be indicative of an open cell condition as in FIG. 6. The memory cell may be deemed healthy for the distribution 510 in a range between threshold values 512 and 514. A distribution of resistance detected to the left of the threshold value 512 may require further analysis. Such further analysis may include application of a (non-melting) set pulse to the memory cell, followed by a subsequent read of the memory cell. The subsequent read of the memory cell may correspond to a data read of the memory cell, using the threshold value 502 as a basis of the read (e.g., for discriminating the value stored in the memory cell). If the subsequent read returns a logical 0, then the memory cell may be deemed healthy. Conversely, if the subsequent read returns a logical 1, then the memory cell may be deemed stuck-at 1.

Variations on the scenario shown in FIG. 8 are possible. For example, if three threshold values are used during a diagnostic read (e.g., the threshold values 502, 512, and 514), then a set operation may be prevented on all memory cells that lie below the threshold value 502.

Figure 9:
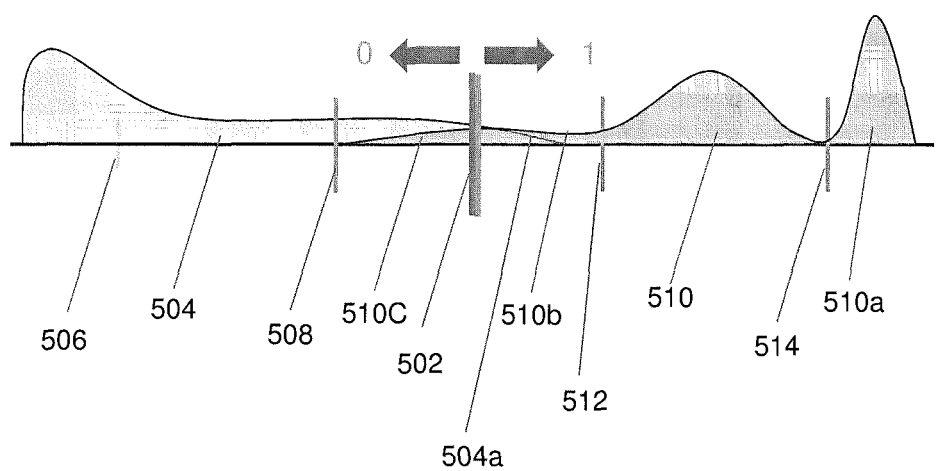

FIG. 9 illustrates a scenario that may be used to detect open memory cells and memory cells with high set resistance. Relative to FIG. 8, the reset distribution 510 includes a portion 510c that is less than (e.g., to the left of) the threshold value 502. In FIG. 9, two diagnostic reads may be performed. The first diagnostic read may use four threshold values and the second diagnostic read may use two threshold values. As before, to the right of threshold value 514, a memory cell may be deemed stuck-at 1. In between threshold values 512 and 514 the memory cell may be deemed healthy. To the left of the threshold value 508 the memory cell may be deemed healthy. In between the threshold values 508 and 502, the memory cell may need further analysis (A). In between the threshold values 502 and 512, the memory cell may need further analysis (B).

If, in connection with FIG. 9, further analysis (either A or B) is needed, then a set pulse may be applied to the memory cell. If further analysis A is performed, if the resistance returns a value less than 508 the memory cell may be deemed stuck-at 0, and otherwise the memory cell may be deemed healthy. If further analysis B is performed, if the resistance returns a value less than threshold value 502 the memory cell may be deemed healthy, and otherwise the memory cell may be deemed stuck-at 1.

The scenarios described above in connection with FIGS. 5-9 are illustrative and are merely intended to provide an appreciation of the types of distributions that may be encountered. Other scenarios are within the scope and spirit of the disclosure.

Figure 10:
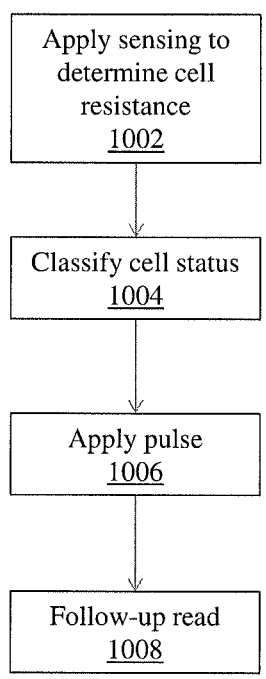
FIG. 10 depicts a process flow for determining which memory cells in a memory are in a stuck-at condition and what value flow chart of an exemplary method in accordance with one or more embodiments.

FIG. 10 illustrates a method that may be used to analyze which memory cells associated with a memory device are stuck, and to what value they are stuck. Such an analysis may be performed before data is written to the memory cells.

In block 1002, resistance associated with a memory cell may be measured or sensed (in this example, resistance is the measurement property). In some embodiments, the sensing may include multi-level sensing. The resistance may be measured in connection with a diagnostic read operation. The measurement property is not limited to resistance and may include, for example, impedance, capacitance, and inductance. When a different measurement property is used, different read threshold and diagnostic threshold values (than those used, for example, when the measurement property is resistance) may be used to perform data reads and diagnostic reads.

In block 1004, a memory cell may be classified as being healthy or in a stuck-at condition based on the resistance associated with block 1002. As part of block 1004, if a memory cell is classified as being in a stuck-at condition, the stuck-at value may be determined (e.g., stuck-at 0 or stuck-at 1). In an embodiment, the stuck-at value is output as the diagnostic data value along with an indication that the memory cell is stuck.

In block 1006, a pulse (e.g., an annealing pulse) may be applied to the memory cell.

In block 1008, a follow-up diagnostic read may be performed.

The blocks or operations of the method of FIG. 10 are illustrative. In some embodiments, one or more operations (or portion(s) thereof) may be optional. In some embodiments, additional operations not shown may be included. In some embodiments, the operations may be executed in an order or sequence different from what is shown in FIG. 10.

The information or status obtained as a result of executing the method of FIG. 10 may be used in any number of ways. For example, the information may be used to avoid writing memory cells that have been diagnosed as "stuck-at." In some embodiments, a controller may be configured to only write a value to a stuck-at memory cell that corresponds to the stuck-at value. In some embodiments, the stuck-at analysis may be disregarded with a (low) probability, such that it is less likely that a memory cell deemed a stuck-at memory cell is written relative a memory cell deemed healthy. In this manner, the stuck-at analysis may receive considerable weight, but might not preclude a memory cell from being written if deemed stuck.

The values shown and described herein in connection with the various embodiments are illustrative. In some embodiments, values or configurations different than those explicitly described herein may be used.

Technical effects and benefits include an ability to determine if a memory cell is stuck. Such a determination may be made in connection with one or more read operations (e.g., a diagnostic read operation). In some embodiments, a diagnostic read operation may be associated with one or more levels, threshold values, or resolutions. In some embodiments, a pulse (e.g., an annealing pulse) may be transmitted to a memory cell to slightly change a resistance associated with the memory cell. The change in the resistance may be measured. Embodiments of the disclosure are used to extend the operational life of a memory by strategically accessing or utilizing memory cells included in the memory based on whether the memory cells are deemed healthy or stuck-at a particular value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized, such as one or more non-transitory computer readable mediums. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method comprising:
performing a diagnostic read of a memory cell in a memory system, the memory system configured to utilize at least one read threshold value to determine a read data value stored in the memory cell when performing a data read operation on the memory cell, the performing a diagnostic read comprising:
comparing a measurement property of the memory cell to at least one diagnostic threshold value, at least one of the diagnostic threshold values different from all of the at least one read threshold values; and identifying the memory cell as being stuck in a physical state based on the comparing; and based on identifying the memory cell as being stuck in a physical state, outputting an indication that memory cell is stuck and a diagnostic data value associated with the physical state.

2. The method of claim 1, further comprising:

comparing the measurement property of the memory cell to the read threshold value to determine the read data value stored in the memory cell; and outputting the read data value.

3. The method of claim 1, wherein there is exactly one diagnostic threshold value.

4. The method of claim 1, wherein the measurement property is resistance.

5. The method of claim 1, wherein there are three diagnostic threshold values defining four distinct regions, two of the four distinct resistance regions correspond to the memory cell being stuck in a physical state and the other two of the four distinct regions correspond to the memory cell not being stuck in a physical state.

6. The method of claim 1, wherein the memory cell is a phase change memory cell and the method further comprises:

applying an annealing pulse to the memory cell; and reading the memory cell after applying the annealing pulse to obtain an after annealing pulse value stored in the memory cell, wherein the identifying the memory cell as being stuck in a physical state is further based on the after annealing pulse value stored in the memory cell.

7. The method of claim 1, further comprising:

receiving write data to be written to the memory system; and generating a write word that takes into account diagnostic data values of stuck memory cells in the memory system.

8. The method of claim 1, wherein the memory cell identified as being stuck is treated as a memory cell that is not stuck with a probability specified by a parameter.

9. The method of claim 1, wherein the memory cell is a phase change memory.

10. A system comprising:

a memory having computer readable computer instructions; and a processor for executing the computer readable instructions, the instructions including:

performing a diagnostic read of a memory cell in a memory system, the memory system configured to utilize at least one read threshold value to determine a read data value stored in the memory cell when performing a data read operation on the memory cell, the performing a diagnostic read comprising:

comparing a measurement property of the memory cell to at least one diagnostic threshold value, at least one of the diagnostic threshold values different from all of the at least one read threshold values; and identifying the memory cell as being stuck in a physical state based on the comparing; and based on identifying the memory cell as being stuck in a physical state, outputting an indication that memory cell is stuck and a diagnostic data value associated with the physical state.

11. The system of claim 10, where the instructions further include:

comparing the measurement property of the memory cell to the read threshold value to determine the read data value stored in the memory cell; and outputting the read data value.

12. The system of claim 10, wherein there is exactly one diagnostic threshold value.

13. The system of claim 10, wherein the measurement property is resistance.

14. The system of claim 10, wherein there are three diagnostic threshold values defining four distinct regions, two of the four distinct resistance regions correspond to the memory cell being stuck in a physical state and the other two of the four distinct regions correspond to the memory cell not being stuck in a physical state.

15. The system of claim 10, wherein the memory cell is a phase change memory cell and the method further comprises:

applying an annealing pulse to the memory cell; and reading the memory cell after applying the annealing pulse to obtain an after annealing pulse value stored in the memory cell, wherein the identifying the memory cell as being stuck in a physical state is further based on the after annealing pulse value stored in the memory cell.

16. The system of claim 10, wherein the instructions further include:

receiving write data to be written to the memory system; and generating a write word that takes into account diagnostic data values of stuck memory cells in the memory system.

17. The system of claim 10, wherein the memory cell identified as being stuck is treated as a memory cell that is not stuck with a probability specified by a parameter.

18. A computer program product comprising:

a non-transitory computer readable storage medium having program code embodied therewith, the program code executable by a processor to:

perform a diagnostic read of a memory cell in a memory system, the memory system configured to utilize at least one read threshold value to determine a read data value stored in the memory cell when performing a data read on the memory cell, the performing a diagnostic read comprising:

comparing a measurement property of the memory cell to at least one diagnostic threshold value, at least one of the diagnostic threshold values different from all of the at least one read threshold values; and identify the memory cell as being stuck in a physical state based on the comparing; and based on identifying the memory cell as being stuck in a physical state, output an indication that memory cell is stuck and a diagnostic data value associated with the physical state.

19. The computer program product of claim 18, wherein the program code is further executable by the processor to:

compare the measurement property of the memory cell to the read threshold value to determine the read data value stored in the memory cell; and output the read data value.

20. The computer program product of claim 18, wherein the program code is further executable by the processor to:

receive write data to be written to the memory system; and generate a write word that takes into account diagnostic data values of stuck memory cells in the memory system.

* * * * *